United States Patent

[11] 3,615,946

[72] Inventor Gerald G. Palmer
Liverpool, N.Y.
[21] Appl. No. 687,195
[22] Filed Dec. 1, 1967
[45] Patented Oct. 26, 1971
[73] Assignee General Electric Company

[54] METHOD OF EMBEDDING SEMICONDUCTOR CHIP WITHIN A DIELECTRIC LAYER FLUSH WITH SURFACE
3 Claims, 3 Drawing Figs.

[52] U.S. Cl. .......... 156/3, 29/569, 74/52, 156/18, 156/303.1, 264/272
[51] Int. Cl. .......... B32b 31/14, C23f 1/00
[50] Field of Search .......... 156/3, 17, 18, 22, 303.1, 298; 317/234, 239, 240; 174/68.5, 52; 264/272; 29/569, 588, 589

[56] References Cited

UNITED STATES PATENTS

| | | | |
|---|---|---|---|
| 2,606,960 | 8/1952 | Little | 156/17 X |
| 2,692,190 | 10/1954 | Pritikin | 156/3 |
| 2,874,085 | 2/1959 | Brietzke | 161/DIG. 7 |
| 3,142,783 | 7/1964 | Warren | 161/DIG. 7 |
| 3,219,749 | 11/1965 | Schuster et al. | 156/3 X |

*Primary Examiner*—Robert F. Burnett
*Assistant Examiner*—William A. Powell
*Attorneys*—Marvin A. Goldenberg, Richard V. Lang, Frank L. Neuhauser, Oscar B. Waddell and Melvin M. Goldenberg ABSTRACT: A method of embedding a semiconductor chip within a dielectric bonding layer, normally employed to bond said chip to a dielectric supporting substrate, so that the metallized face of said chip is flush with an extremely smooth surface of the dielectric layer. The present method permits readily made coplanar connections between the chip's contact electrodes and conductive patterns that may be formed contiguous with the dielectric layer surface. In performing the process, a chip is set upon the layer of dielectric material. A thin sheet of metal is placed over the chip and the surface of the dielectric layer. A platen, the face of which is ground flat to a high degree of smoothness, is pressed down upon the metal sheet in the presence of heat applied to said dielectric layer until the face of the chip becomes flush with the surface of said layer. The platen is removed and the metal sheet etched away.

INVENTOR:
GERALD G. PALMER,
BY [signature]
HIS ATTORNEY.

METHOD OF EMBEDDING SEMICONDUCTOR CHIP WITHIN A DIELECTRIC LAYER FLUSH WITH SURFACE

BACKGROUND OF THE INVENTION

1. Field of the Invention

The invention relates to the field of integrated circuits and more particularly to the bonding of semiconductor chips to a common supporting substrate. As used herein, semiconductor chips are intended to include within their meaning all forms of miniaturized electronic components in packaged or quasi-packaged form, such as monolithic chips, beam lead devices, hybrid devices, etc., which can be mounted and interconnected on a single substrate.

2. Description of the Prior Art

In accordance with present day techniques, semiconductor chips are commonly bonded to their substrates by employing a thin film of adhesive material which bonds the undersurface of the chip to the substrate. In these cases the face of the chip having the contact electrodes formed thereon is at a different level than the substrate surface, different by the thickness of the chip. Jumper wires are normally employed for making connection between the contact electrodes and conductive patterns formed on the substrate. In a copending application entitled "Composite Integrated Circuits with Coplanar Connections to Semiconductor Chips Mounted on a Single Substrate," Ser. No. 687,278 filed Dec. 1, 1967 by C. S. Kim and G. G. Palmer and assigned to the assignee of the present invention, there is described a structure wherein a semiconductor chip may be bonded to a supporting substrate by being embedded within a thermoplastic dielectric bonding layer with the face of the chip flush with the bonding layer surface. For such configuration coplanar connections can be made between the chip and the conductive structure by metallization deposited on the surface of the dielectric layer. To insure that the metallization is readily deposited on and adheres firmly to the dielectric layer surface, and that reliable coplanar connections are made to the chip, it is important (1) that the surface be uniformly smooth throughout; and (2) that the embedded chip be precisely flush with the surface. Existing techniques do not readily satisfy these requirements.

SUMMARY OF THE INVENTION

It is accordingly a principal object of the present invention to provide an improved method of embedding a semiconductor chip within a dielectric bonding layer so that the chip is flush with the surface of the dielectric layer within a tolerance on the order of a micron and the surface is uniformly smooth throughout.

It is another object of the invention to provide an improved method of embedding a semiconductor chip within a dielectric bonding layer in the manner above described, performed under the application of pressure and heat and which does not require a mechanical operation for smoothing the dielectric layer surface once the chip is embedded.

It is a further object of the invention to provide an improved method of embedding a semiconductor chip within a dielectric bonding layer, as described, that may be simply and accurately performed.

It is still a further object of the invention to provide an improved method of embedding a semiconductor chip within a dielectric bonding layer in the manner described, wherein said bonding layer is employed to bond said chip to a dielectric substrate.

These and other objects of the invention are accomplished by the following process: Placing the chip on the surface of a dielectric thermoplastic bonding layer; applying a layer of metal, which may be in the form of several thin sheets, over the entire surface of the dielectric layer including the semiconductor chip; heating the dielectric softened material to a condition in which it will adhere to other materials under applied pressure; pressing a metal platen, the face of which has been ground smooth, to the metal sheet covering the semiconductor chip until the chip becomes flush embedded within the dielectric layer; removing said platen, etching completely said layer of metal by subjecting it to an etch solution; and cooling the dielectric layer.

In one specific embodiment of the invention an FEP Teflon is employed as the bonding material, which material is heated to a temperature of 300° to 350° C. under an applied pressure of between 100–1000 p.s.i.

BRIEF DESCRIPTION OF THE DRAWING

The specification concludes with claims particularly pointing out and distinctly claiming the subject matter which is regarded as the invention. It is believed, however, that both as to its organization and method of operation, together with further objects and advantages thereof, the invention may be best understood from the description of the preferred embodiments, taken in connection with the accompanying drawings in which:

DESCRIPTION OF A PREFERRED EMBODIMENT

Figure 1:
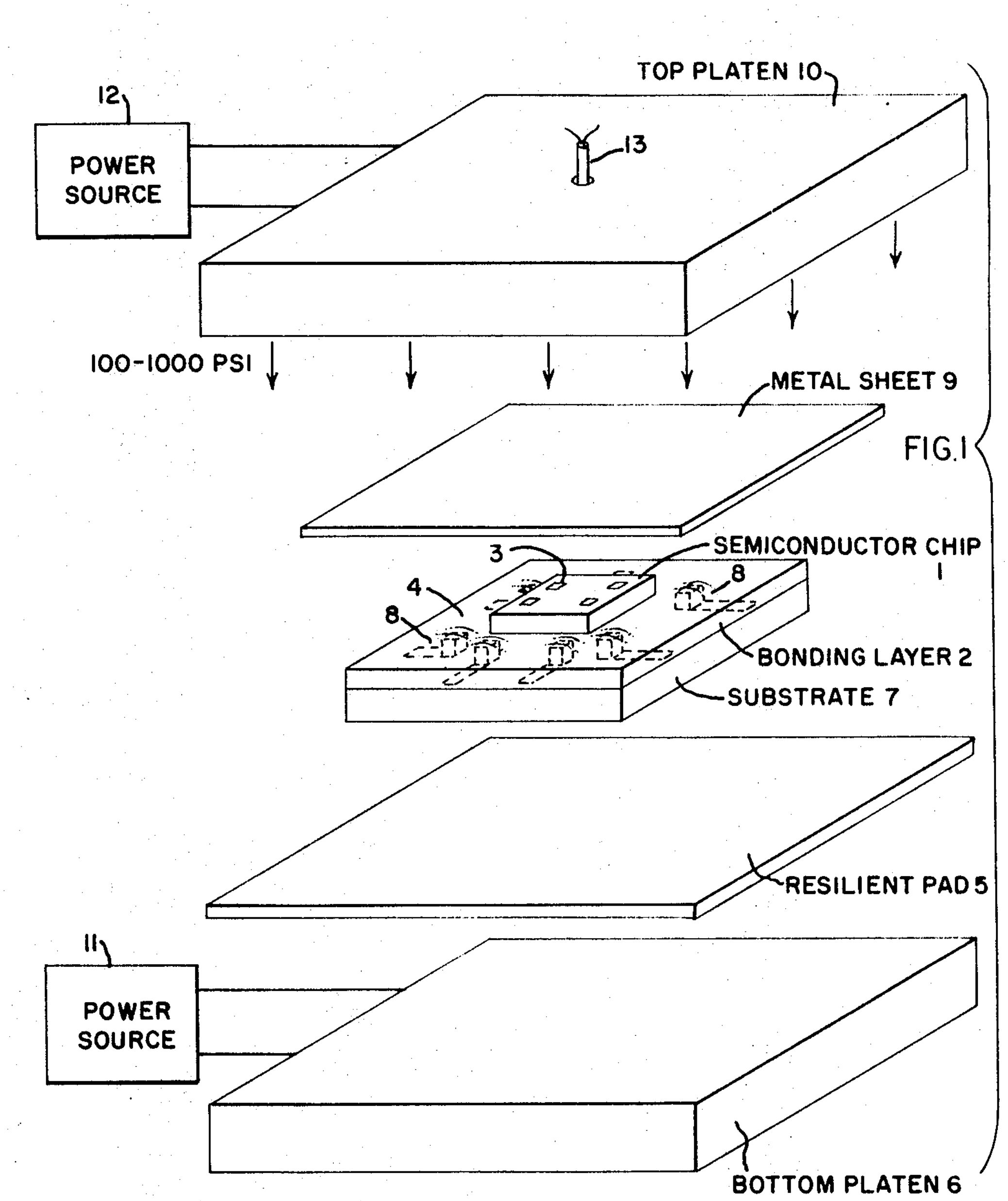
FIG. 1 is an exploded view schematically illustrating a first sequence of steps of the invention wherein a semiconductor chip is pressed into a dielectric bonding layer.

With reference to FIG. 1, there is illustrated in an exploded view the apparatus employed in performing a first sequence of steps of the present process wherein a semiconductor chip 1 is embedded within a bonding layer 2 so that the upper surface of the chip, and in particular the contact electrodes 3, are flush with the surface 4 of the bonding layer, and the entire surface of the bonding layer is uniformly smooth. In general, the drawing is intended to provide a schematic representation of the steps of the process. It will be appreciated that in practice the process may be performed either at a single station or at a plurality of stations, as may be most suitable.

A resilient pad 5, for example a silicone rubber, is placed upon a bottom platen 6 and a dielectric substrate 7, carrying the bonding layer and semiconductor chip, is then set upon the pad. In the process being described the bonding layer employed is an FEP Teflon. However, the precise nature of the material is not critical to the process and it should be recognized that other thermoplastic bonding materials can be employed.

At this stage in the process the semiconductor chip 1 merely rests upon the surface of the bonding layer 2. The chip may be held in position prior to embedding by heating the layer 2 so as to lightly adhere the chip to the surface 4. In addition, a cavity may be preformed on the surface 4 of dimensions corresponding to those of the chip for assisting in positioning the chip.

In the present embodiment the bonding layer 2 is about 2-mils thick and the chip 1 several microns to ½-mil less. The layer may have been previously adhered to the substrate 7 by conventional methods. As a result of its fabrication, the bonding layer surface 4 will normally have some roughness or unevenness. In addition, where there are relief patterns formed on the surface of the substrate 7, such as may be part of the conductive structure of the chip's peripheral circuitry, denoted in FIG. 1 by the reference numeral 8, a corresponding unevenness is reflected at the surface 4. This unevenness of the surface 4, plus the tendency of the surface to ride up around the chip as it is embedded must be overcome by the embedding process. The embedding process must in addition provide a coplanar mounting of the chip face to the surface 4 within a tolerance less than the thickness of the contact electrodes, which may be several thousand angstroms to several microns.

In the next step of the process, a thin metal sheet 9, for example of aluminum or copper about several microns thick, is placed over the entire surface 4, including the semiconductor chip 1. The top platen 10 is then brought down upon the metal sheet 9. Prior to pressing by the top platen 10, the bonding layer 2 is heated to the softening point so that it will adhere under pressure. The heating may be accomplished by conventional means, for example, by energizing heating elements in the bottom platen 6 and top platen 10 from power sources 11 and 12, which heat is conducted to the bonding layer. A thermocouple 13 is inserted in a well in the top platen for providing an indication of the heating temperature. The top platen 10, the bottom face of which is flat and polished to a high degree of smoothness, e.g., to within on the order of a micron, is then pressed down on the metal sheet 9 so as to force the chip 1 into the layer 2. In the embodiment being considered the bonding layer was heated to a temperature of between 300° and 350° C. and the top platen 10 pressed down at a pressure of between 100–1000 p.s.i. During the pressing process, both the resilient pad 3 and the metal sheet 6 act to absorb some of the pressure so as to prevent the semiconductor chip 1 and the substrate 7 from fracturing.

Figure 2:
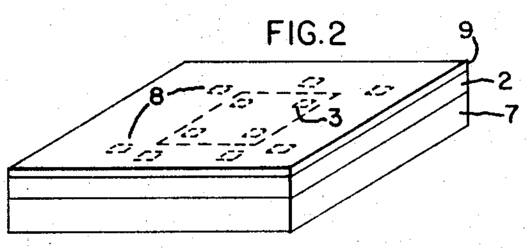
FIG. 2 is a perspective view of the semiconductor chip and bonding layer prior to the final etching step having been performed.
Figure 3:
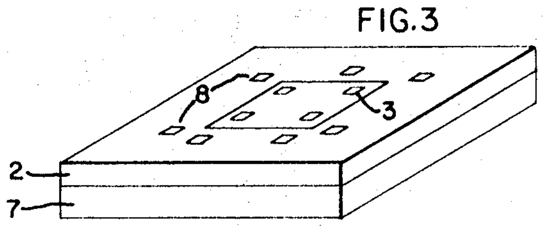
FIG. 3 is a perspective view similar to FIG. 2 after the final etching step has been performed.

The pressing operation acts to embed the chip 1 within the bonding layer 2 with the metal sheet 9 directly overlaying. The top platen 10 is then removed and that much of the structure including the substrate 7, the embedded semiconductor chip 1 and the overlaying metal layer 9 are removed from the bottom platen, as shown in FIG. 2. The metal sheet 9 is then entirely removed by the application of a selective etch solution, such as a dilute solution of sulfuric acid for aluminum or a ferric chloride solution for copper. Upon removal of the metal layer, a smooth surface bonding layer with the chip flush embedded therein is revealed as illustrated in FIG. 3.

It is intended that the appended claims be construed to include all modifications and variations that reasonably fall within the true scope of the invention.

What I claim as new and desire to secure by Letters Patent of the United States is:

1. A method of embedding a semiconductor chip within a dielectric layer including the steps of:
   a. placing the chip on the surface of said dielectric layer,
   b. laying a thin metal sheet over the surface of said layer including said semiconductor chip,
   c. pressing a platen having a flat, smoothed face upon said metal sheet so as to force the chip into the layer until the surface of the chip is flush with the surface of the layer, and
   d. etching away said metal sheet so as to expose a uniformly smooth surfaced dielectric layer with the semiconductor chip embedded flush therewith.

2. A method of embedding a semiconductor chip as in claim 1 wherein said dielectric layer is a thermoplastic material, which further includes heating the dielectric layer prior to pressing and cooling of said layer prior to etching.

3. A method of embedding a semiconductor chip as in claim 2 wherein said dielectric layer is supported by a dielectric substrate which includes placing said substrate upon a padded bottom platen prior to heating.

* * * * *